United States Patent
Kim et al.

(10) Patent No.: US 7,301,845 B2
(45) Date of Patent: Nov. 27, 2007

(54) DEFECT ADDRESS STORING CIRCUIT FOR SEMICONDUCTOR MEMORY DEVICE

(75) Inventors: Chang-Rae Kim, Yongin-si (KR); Dong-Chung Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1 day.

(21) Appl. No.: 11/319,282

(22) Filed: Dec. 29, 2005

(65) Prior Publication Data
US 2006/0164893 A1    Jul. 27, 2006

(30) Foreign Application Priority Data
Jan. 25, 2005    (KR)    ......... 10-2005-0006840

(51) Int. Cl.
G11C 17/16    (2006.01)
(52) U.S. Cl. .................. 365/225.7; 365/200
(58) Field of Classification Search ............ 365/96
See application file for complete search history.

(56) References Cited

U.S. PATENT DOCUMENTS

| | | | |
|---|---|---|---|
| 4,922,920 A * | 5/1990 | Thie et al. ............ 600/512 |
| 5,862,087 A * | 1/1999 | Lee ..................... 365/200 |
| 6,545,920 B2 * | 4/2003 | Lee et al. .............. 365/200 |
| 7,075,848 B2 * | 7/2006 | Choi et al. ............. 365/225.7 |
| 2003/0026147 A1 * | 2/2003 | Bang et al. ............. 365/201 |

FOREIGN PATENT DOCUMENTS

| | | |
|---|---|---|
| JP | 11-162190 | 6/1999 |
| KR | 100183847 | 12/1998 |
| KR | 100207512 | 4/1999 |
| KR | 1020000066270 | 11/2000 |
| KR | 1020020039743 | 5/2002 |

* cited by examiner

*Primary Examiner*—Tan T. Nguyen
(74) *Attorney, Agent, or Firm*—Volentine & Whitt, PLLC

(57) ABSTRACT

A defect address storing circuit for a semiconductor memory device comprises a plurality of fuse pairs formed in a fuse region and a plurality of transistors formed in a transistor region outside the fuse region. The plurality of fuse pairs and the plurality of transistor pairs are arranged to form a continuous current path through at least one fuse in each of the plurality of fuse pairs, and through at least one transistor in each of the plurality of transistor pairs.

19 Claims, 6 Drawing Sheets

DEFECT ADDRESS STORING CIRCUIT FOR SEMICONDUCTOR MEMORY DEVICE

BACKGROUND OF THE INVENTION

1. Field of the Invention

The present invention relates generally to a semiconductor memory device. More particularly, the invention relates to a defect address storing circuit for a semiconductor memory device.

A claim of priority is made to Korean Patent Application No. 2005-06840 filed on Jan. 25, 2005, the disclosure of which is hereby incorporated by reference in its entirety.

2. Description of the Related Art

Memory arrays in integrated circuit (IC) memory devices often contain defective memory cells. To prevent the defective memory cells from jeopardizing the performance of the memory devices, memory arrays often provide redundant memory cells that act as substitutes for the defective memory cells. In these memory arrays, whenever a defective memory cell is detected, a redundant memory cell is assigned to replace the defective memory cell. Then, whenever an address corresponding to the defective memory cell is provided to the memory array, the redundant memory cell is accessed instead. In this written description, an address for a defective memory cell is referred to as a "defect address".

Defect addresses are generally stored in memory devices using special defect address storing circuits. A defect address storing circuit monitors memory access operations in the memory array to detect whenever a defect address is provided to the memory array. Upon detecting a memory access operation involving a defect address, the defect address storing circuit causes a redundant memory cell to be accessed instead of the defective memory cell.

A defect address is typically stored in a defect address storing circuit by blowing fuses in the defect address storing circuit according to a particular address to be represented therein. The fuses are blown according to a specific pattern such that an output signal of the defect address storing circuit will take on a particular value only when a defect address is input to the defect address storing signal.

For example, suppose that '001' has been identified as a defect address. Then specific fuses in a defect address storing circuit will be blown so that a signal output of the defect address storing circuit assumes a logic state '0' only when the address '001' is presented to the defect address storing circuit. Accordingly, whenever the output signal of the defect address storing circuit assumes logic state '0', the memory device will access a redundant memory cell for address '001' rather than a defective one.

Figure (FIG.) 1 is a circuit diagram illustrating a conventional defect address storing circuit 100 such as the one disclosed in U.S. Pat. No. 6,545,920.

Referring to FIG. 1, defect address storing circuit 100 includes three address storage blocks connected to each other in series. Each of the address storage blocks comprises a pair of fuses electrically connected to each other and a pair of N-Type metal-oxide semiconductor (NMOS) transistors respectively connected to the pair of fuses. The NMOS transistors in each address storage block are also electrically connected to each other.

A first address storage block comprises a first pair of fuses F1a and F1b electrically connected to each other at an upper node of the first address storage block. A first pair of NMOS transistors T1a and T1b respectively connected between fuses F1a and F1b and a lower node of the first address storage block. A second address storage block comprises a second pair of fuses F2a and F2b electrically connected to each other at the lower node of the first address storage block, and a second pair of NMOS transistors T2a and T2b respectively connected between fuses F2a and F2b and a lower node of the second address storage block. A third address storage block comprises a third pair of fuses F3a and F3b electrically connected to each other at the lower node of the second address storage block, and a third pair of NMOS transistors T3a and T3b respectively connected between fuses F3a and F3b and a lower node of the third address storage block.

In the above and subsequent description, the term "node" is used to denote a portion of a circuit with substantially uniform electrical potential. Two elements connected to the same node may be viewed as being electrically connected to each other. The terms "upper node" and "lower node" are used to distinguish relative positions of nodes in circuit diagrams where applicable (e.g., in FIG. 1). However, the terms "upper" and "lower" should not necessarily be read to implicate particular positions for the nodes in an actual circuit layout.

For explanation purposes, it will be assumed that the lower node of the third address storage block is connected to ground and that an output signal of defect address storing circuit 100 is read at the upper node of the first storage block. It will be further assumed that the upper node of the first storage block is connected to a power supply through a resistance such that when a current path exists between the upper node of the first storage block and the lower node of the third storage block, the voltage level of the output signal will be the same as ground, i.e., the output signal will have a logic state '0'.

In FIG. 1, NMOS transistors T1a and T1b are respectively controlled by complementary address signals nA0 and A0, NMOS transistors T2a and T2b are respectively controlled by complementary address signals nA1 and A1, and NMOS transistors T3a and T3b are respectively controlled by complementary address signals nA2 and A2.

To store a defect address in defect address storing circuit 100, fuses corresponding to the defect address should be blown. For example, to store the address '001' in defect address storing circuit 100, fuses F1b, F2b, and F3a should be blown so that the output signal will only have logic state '0' when address signals A0, A1, and A2 have respective logic states '0', '0', and '1'. In other words, with fuses F1b, F2b, and F3a blown, a current path will only be formed between the upper node of the first storage block and ground when transistors T1a, T2a, and T3b are turned on by respective signals nA0, nA1, and nA2 with values '1', '1', and '1'.

FIG. 2 is a block diagram showing a layout of defect address storing circuit 100 shown in FIG. 1. Referring to FIG. 2, defect address storing circuit 100 comprises a fuse region 110, a first transistor region 120, and a second transistor region 130.

First through third fuse pairs F1, F2, and F3 are arranged in fuse region 110, first and third transistor pairs T1 and T3 are arranged in first transistor region 120, and second transistor pair T2 is arranged in second transistor region 130.

First and third transistor pairs T1 and T3 are controlled by a first bus line BL1a, and second transistor pair T2 is controlled by a second bus line BL1b. Address signals nA0, A0, nA2, and A2 (See FIG. 1) are provided to first and third transistor pairs T1 and T3 by first bus line BL1a, and address signals nA1 and A1 are provided to second transistor pair T2 by second bus line BL1b.

FIG. 3 is a block diagram of a semiconductor memory device 300 including a plurality of defect address storing circuits. Referring to FIG. 3, semiconductor memory device 300 comprises six defect address storing circuits. Each of the defect address storing circuits has the same or similar structure as that of defect address storing circuit 100 shown in FIG. 2. In particular, each of the defect address storing circuits includes first and second transistor regions, and a fuse region between the first and second transistor regions. The first and second transistor regions of three of the defect address storing circuits are respectively connected to bus lines BL1a and BL1b, while the first and second transistor regions of the other three of the defect address storing circuits are respectively connected to bus lines BL2a, and BL2b.

In the conventional defect address storing circuit shown in FIG. 1, fuse and transistor pairs are alternately arranged. As a result, first and second transistor regions 120 and 130 are arranged with fuse region 110 therebetween as shown in FIG. 2.

Semiconductor memory device 300 shown in FIG. 3 has various shortcomings. First, because its layout includes two transistor regions and a fuse region, semiconductor memory device 300 occupies a large area. Second, because first and second transistor regions 120 and 130 are separated by fuse region 110, they cannot share a bus line.

SUMMARY OF THE INVENTION

According to one embodiment of the present invention, a defect address storing circuit for a semiconductor memory device is provided. The defect address storing circuit comprises a plurality of fuses formed in a fuse region, and a plurality of transistors respectively connected to the plurality of fuses and formed in a line in a transistor region outside the fuse region. The plurality of fuses and the plurality of transistors are arranged to form a continuous current path spanning an entire width of the defect address storing circuit.

According to another embodiment of the invention, a defect address storing circuit for a semiconductor memory device is provided. The defect address storing circuit comprises a plurality of fuse pairs formed in a fuse region, and a plurality of transistor pairs respectively connected to the plurality of fuse pairs and formed in a line in a transistor region outside the fuse region. The plurality of fuse pairs and the plurality of transistor pairs are arranged to form a continuous current path through at least one fuse in each of the plurality of fuse pairs, and through at least one transistor in each of the plurality of transistor pairs.

According to still another embodiment of the present invention, a defect address storing circuit for a semiconductor memory device is provided. The defect address storing circuit comprises a first plurality of fuse pairs formed in a first fuse region, a second plurality of fuse pairs formed in a second fuse region, a first plurality of transistor pairs formed in a first transistor region between the first and second fuse regions, and a second plurality of transistor pairs formed in a second transistor region between the first transistor region and the second fuse region. The first plurality of fuse pairs and the first plurality of transistor pairs are arranged to form a first continuous current path through at least one fuse in each of the first plurality of fuse pairs, and through at least one transistor in each of the first plurality of transistor pairs, and the second plurality of fuse pairs and the second plurality of transistor pairs are arranged to form a second continuous current path through at least one fuse in each of the second plurality of fuse pairs, and through at least one transistor in each of the second plurality of transistor pairs.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 4:
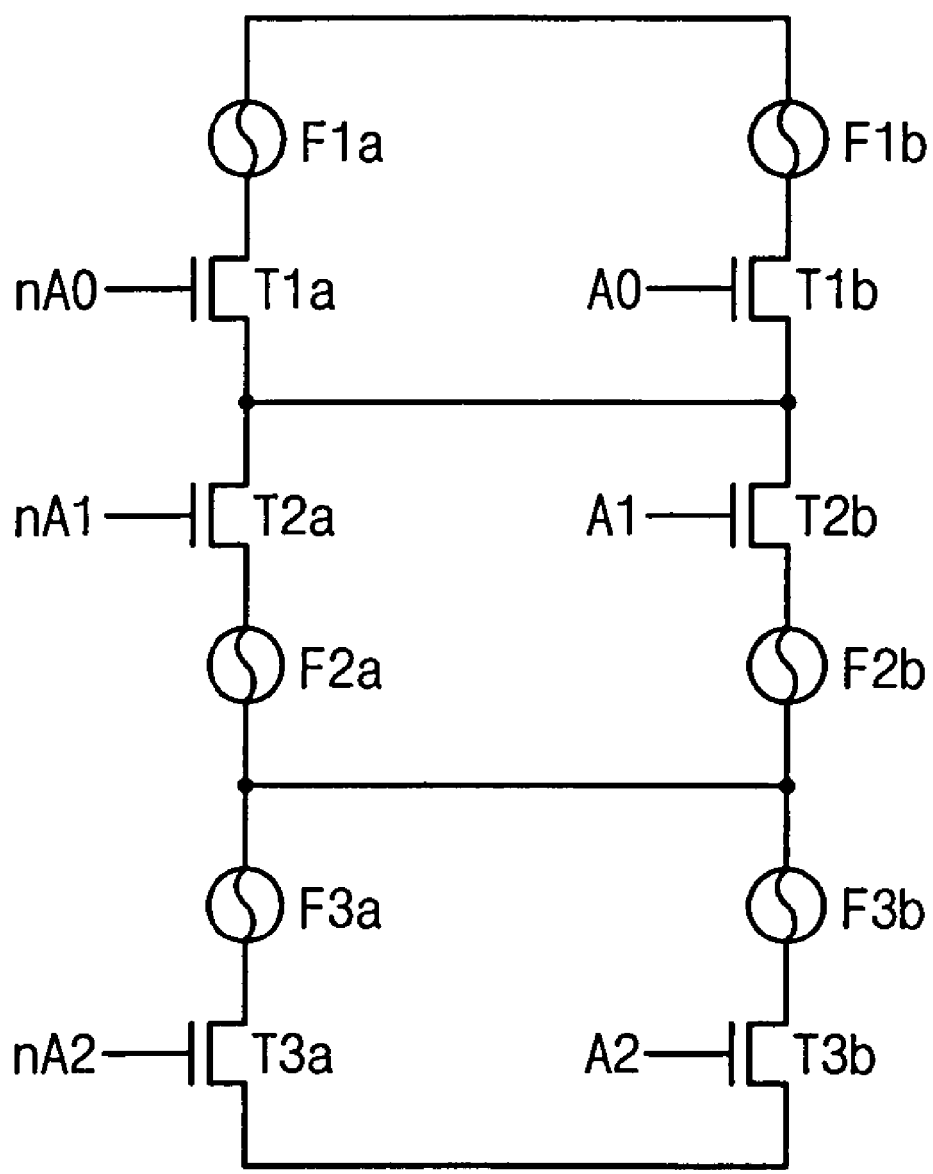
FIG. 4 is a circuit diagram of a defect address storing circuit for a semiconductor memory device according to an embodiment of the present invention.

FIG. 4 is a circuit diagram of a defect address storing circuit for a semiconductor memory device according to one embodiment of the present invention. Referring to FIG. 4, a defect address storing circuit 400 comprises first, second, and third address storage blocks, wherein the first address storage block comprises a first fuse pair F1 and a first transistor pair T1, the second address storage block comprises a second fuse pair F2 and a second transistor pair T2, and the third address storage block comprises a third fuse pair F3 and a third transistor pair T3.

First fuse pair F1 comprises fuses F1a and F1b connected to each other at a upper node of the first address storage block, and first transistor pair T1 comprises transistors T1a and T1b respectively connected between fuses F1a and F1b and a lower node of the first address storage block.

Second transistor pair T2 comprises transistors T2a and T2b connected to each other at the lower node of the first address storage block and second fuse pair F2 comprises fuses F2a and F2b respectively connected between transistors T2a and T2b and a lower node of the second storage address block.

Third fuse pair F3 comprises fuses F3a and F3b connected to each other at the lower node of the second address storage block, and third transistor pair T3 comprises transistors T3a and T3b respectively connected between fuses F3a and F3b and a lower node of the third address storage block.

Transistor pairs T1, T2, and T3 comprise NMOS transistors. Transistors T1a and T1b are respectively controlled by complementary first address signals nA0 and A0, transistors T2a and T2b are respectively controlled by complementary second address signals nA1 and A1, and transistors T3a and T3b are respectively controlled by complementary third address signals nA2 and A2.

Figure 1:
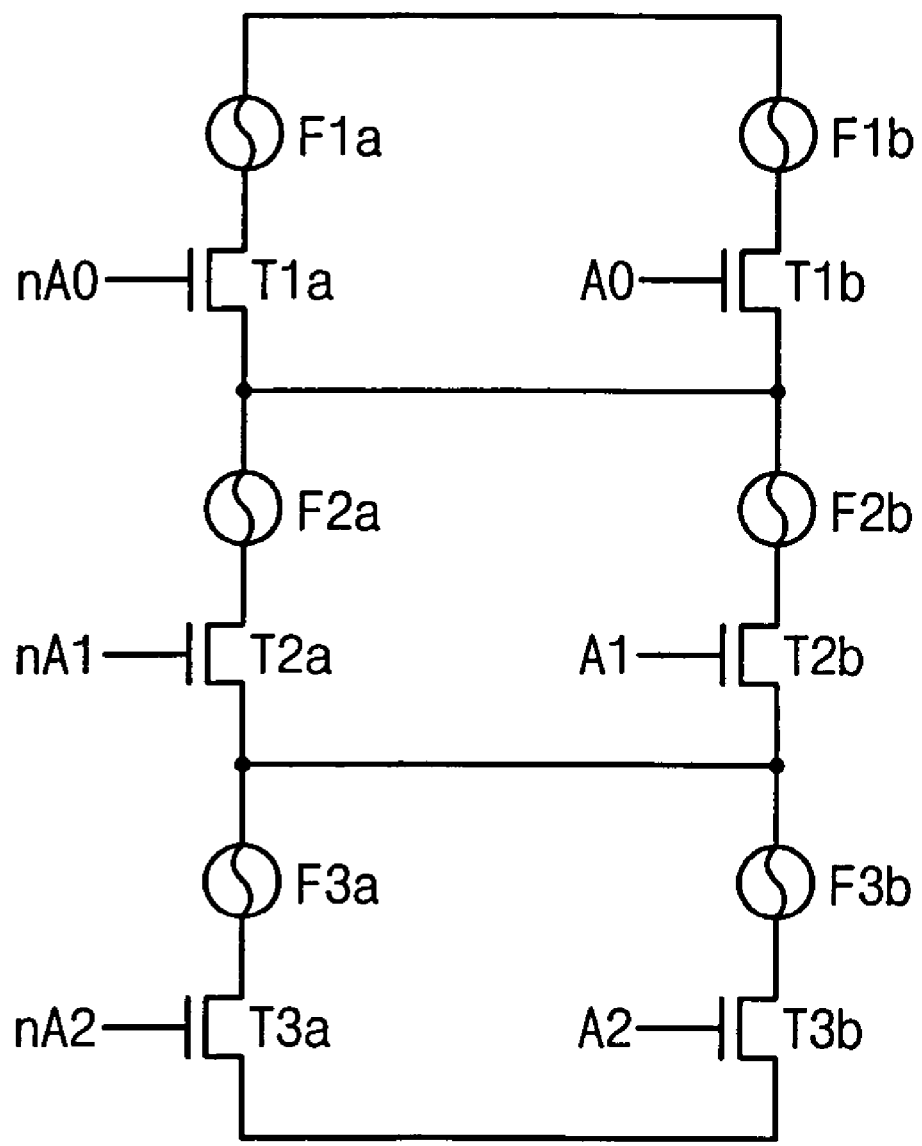
FIG. 1 is a circuit diagram of a conventional defect address storing circuit.

Comparing defect address storing circuit 400 of FIG. 4 with defect address storing circuit 100 of FIG. 1, the respective positions of second fuse pairs F2a and F2b and second transistor pairs T2a and T2b have been swapped. The effect of swapping these positions will be described with reference to FIG. 5.

Although the defect address storing circuit in FIG. 4 comprises three fuse pairs and three transistor pairs, those skilled in the art will understand that the defect address storing circuit can be constructed using a larger or smaller number of fuse pairs and transistor pairs. For example, defect address storing block could comprise more address storage blocks in order to represent addresses with more bits.

Figure 5:
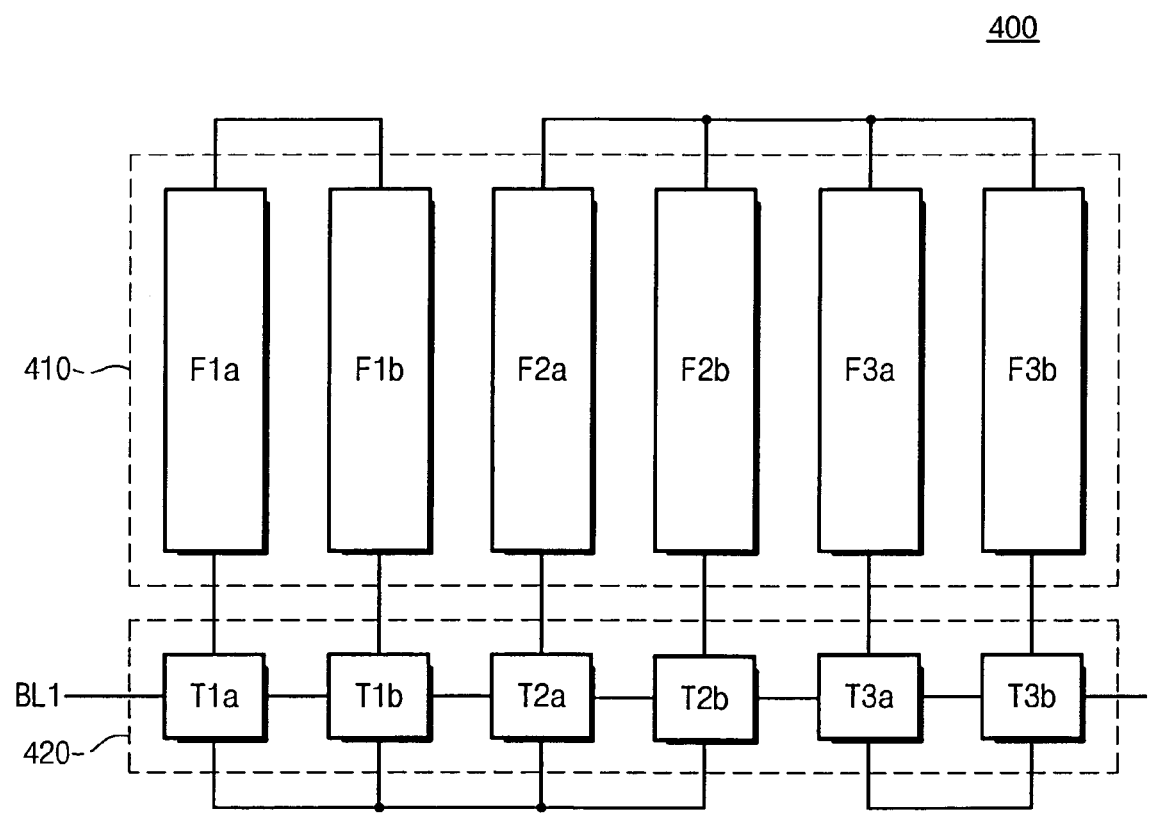
FIG. 5 is a block diagram showing a layout of the defect address storing circuit shown in FIG. 4; and, FIG. 6 is a block diagram of a semiconductor memory device including a plurality of defect address storing circuits according to an embodiment of the present invention.

FIG. 5 is a block diagram showing a layout of defect address storing circuit 400 from FIG. 4. Referring to FIG. 5, defect address storing circuit 400 comprises a fuse region 410 and a transistor region 420.

In fuse region 410, first, second, and third fuse pairs F1, F2, and F3 are arranged in a line. The fuses in each fuse pair are electrically connected with each other. First and second fuse pairs F1 and F2 face each other, but are not electrically connected. In contrast, second and third fuse pairs F2 and F3 face each other and are electrically connected.

In transistor region 420, first, second, and third transistor pairs T1, T2, and T3 are arranged in a line. The transistors within each transistor pair are electrically connected with each other. In addition, transistors T1a and T1b are respectively connected to fuses F1a and F1b, transistors T2a and T2b are respectively connected to fuses F2a and F2b, and transistors T3a and T3b are respectively connected to fuses F3a and F3b. First transistors T1a and T1b and second transistors T2a and T2b face each other and are electrically connected with each other. In contrast, the transistors T2a and T2b and transistors T3a and T3b face each other but are not electrically connected with each other.

Referring to FIG. 5, a first bus line BL1 is formed in transistor region 420. Complementary first through third address signals nA0, A0, nA1, A1, nA2, and A2 (See FIG. 4) are provided to the first through third transistor pairs via first bus line BL1.

Figure 2:
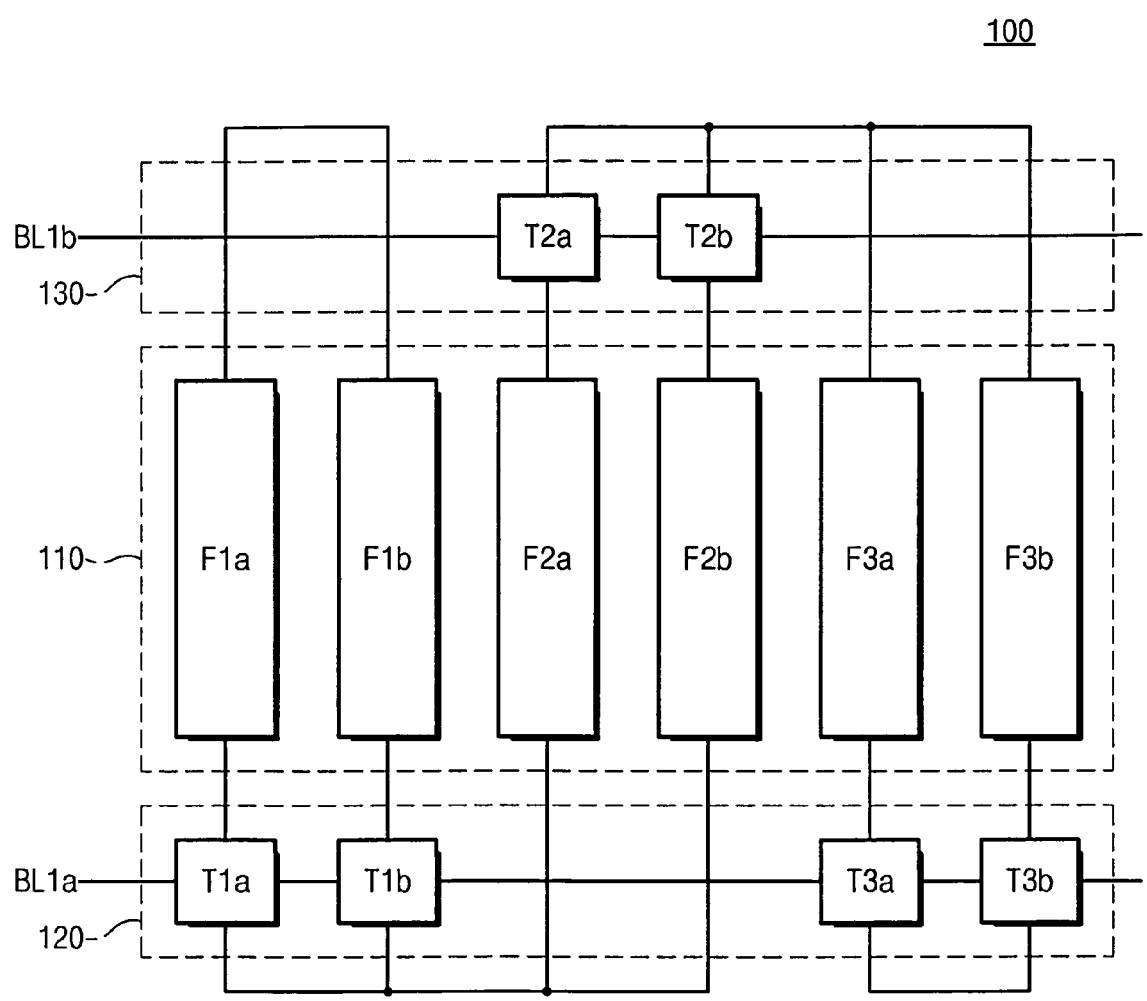
FIG. 2 is a block diagram showing a layout of the defect address storing circuit shown in FIG. 1.

Conventional defect address storing circuit 100 shown in FIG. 2 includes first and second transistor regions 120 and 130 with a fuse region 110 formed therebetween. In FIG. 2, transistors T2a and T2b are located in second transistor region 130. However, in defect address storing circuit 400 shown in FIG. 5, transistor region 420 is arranged on only one side of fuse region 410. This is accomplished by moving second transistor pair T2 and second fuse pair F2 from their positions shown in FIG. 1 to new positions shown in FIG. 4.

In defect address storing circuit 400, a continuous current path is formed by fuses in fuse region 410 and transistors in transistor region 420. The term "continuous current path" here is defined as a continuous sequence of elements forming an uninterrupted electrical connection. Where the continuous current path extends from the terminals of transistors at one end of the line of transistors in transistor region 420 to the terminals of transistors at the other end of the line of transistors in transistor region 420, the continuous current path is said to extend across the entire width of the defect address storing circuit. In FIG. 2, a continuous current path is not formed across the entire width of defect address storing circuit 100 by fuses in fuse region 110 and first transistor region 120 because an electrical connection between third transistor pair T3 and T1 must necessarily pass through second transistor pair T2 in second transistor region 130.

In general, defect address storing circuit 400 is connected between a power supply and ground. For example, the upper node of the first address storage block is typically connected to the power supply and the lower node of the third address storage block is typically connected to ground. A resistor is generally connected between the upper node of the first address storage block and the power supply and an output terminal of the defect address storing circuit may be connected to the upper node of the first address storage block.

By forming defect address storing circuit 400 with one transistor region instead of two, the area of a semiconductor memory device including defect address storing circuit 400 is dramatically reduced relative to conventional defect address storing circuit 100.

Figure 6:
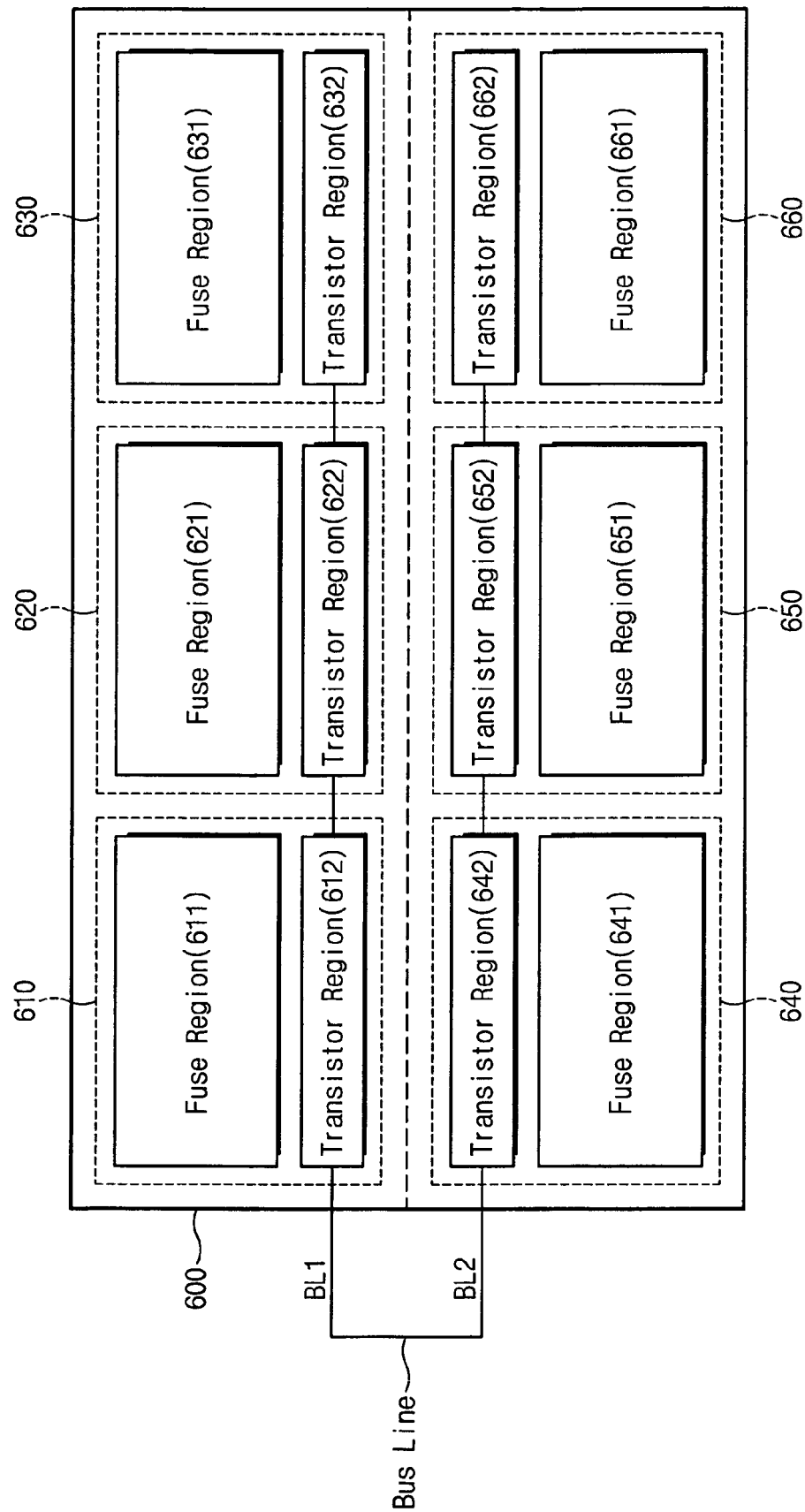

FIG. 6 is a block diagram of a semiconductor memory device including a plurality of defect address storing circuits in accordance with an embodiment of the present invention. The semiconductor memory device of FIG. 6 includes six defect address storing circuits.

First through sixth defect address storing circuits 610, 620, 630, 640, 650, and 660 have the same or similar structure as the defect address storing circuit shown in FIGS. 4 and 5. As an example, first defect address storing circuit 610 includes a fuse region 611 and a transistor region 612 analogous to respective fuse and transistor regions 410 and 420. As shown in FIG. 5, three fuse pairs are arranged in a line in the fuse region 611, and three transistor pairs are arranged in a line in transistor region 612.

Referring to FIG. 6, first through third defect address storing circuits 610, 620, and 630 are controlled by complementary address signals input by a first bus line BL1. Fourth through sixth defect address storing circuits 640, 650, and 660 are controlled by complementary address signals input by a second bus line BL2. First and second bus lines BL1 and BL2 may be integrated as one bus line. That is, the first to sixth defect address storing circuits may be controlled by address signals input on bus line.

Figure 3:
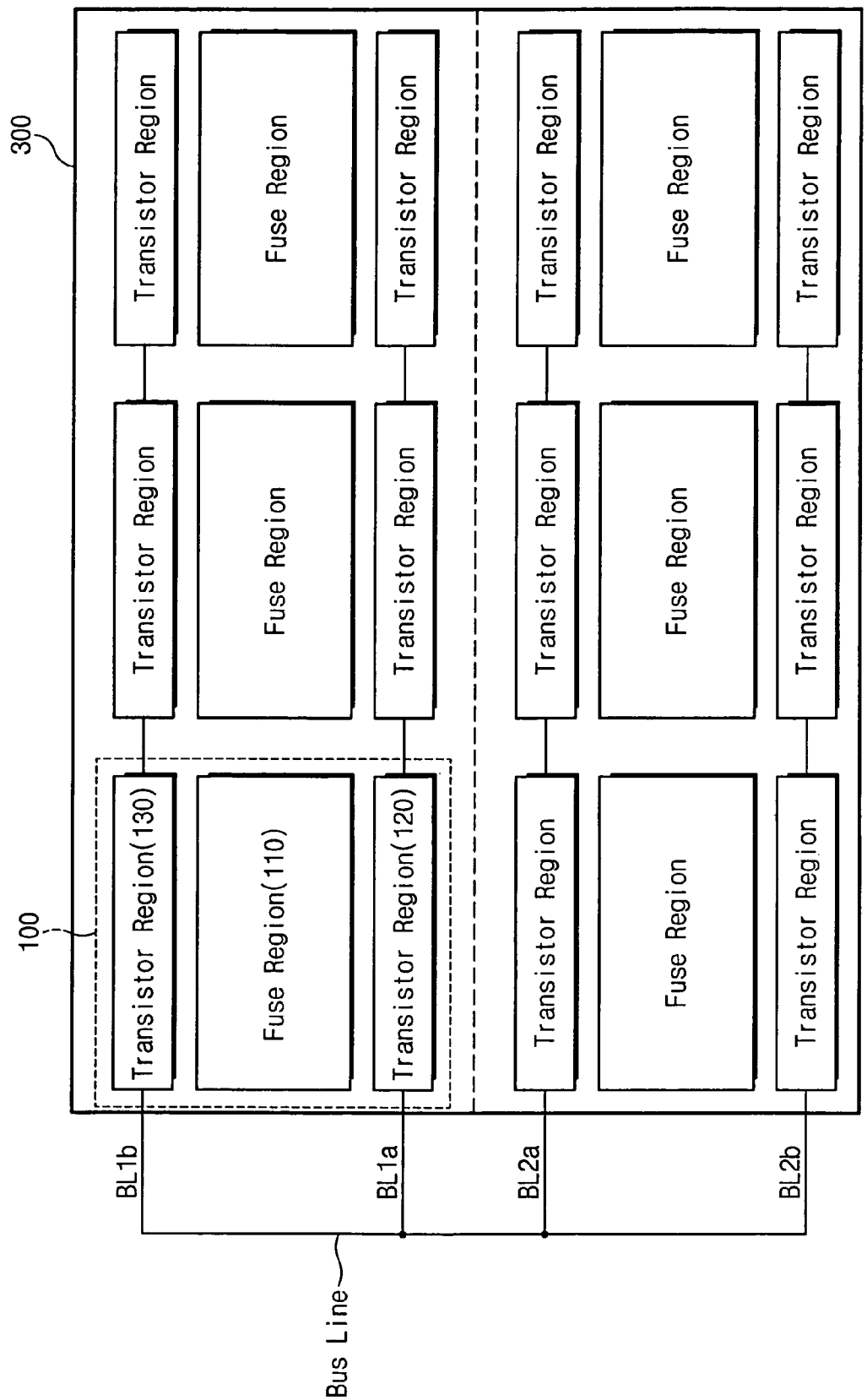
FIG. 3 is a block diagram of a semiconductor memory device including a plurality of defect address storing circuits.

Comparing semiconductor memory device 600 with conventional semiconductor memory device 300 shown in FIG. 3, semiconductor memory device 600 takes up significantly less space and allows address signals to be input through a single bus.

The foregoing preferred embodiments are teaching examples. Those of ordinary skill in the art will understand that various changes in form and details may be made to the exemplary embodiments without departing from the scope of the present invention which is defined by the following claims.

What is claimed is:

1. A defect address storing circuit for a semiconductor memory device, the defect address storing circuit comprising:
    a plurality of fuses formed in a fuse region; and,
    a plurality of transistors respectively connected to the plurality of fuses and formed in a line in a transistor region outside the fuse region;
    wherein the plurality of fuses and the plurality of transistors are arranged to form a continuous current path spanning an entire width of the defect address storing circuit; and,
    wherein the plurality of fuses comprises first and second fuses formed adjacent to one another in the fuse region, the plurality of transistors comprises first and second transistors formed adjacent to one another in the transistor region, and the first and second fuses are connected through the first and second transistors and the first and second fuses are not directly connected to one another.

2. The defect address storing circuit of claim 1, further comprising:
bus lines connected to the plurality of transistors.

3. The defect address storing circuit of claim 1, wherein the plurality of transistors are metal-oxide (MOS) transistors.

4. The defect address storing circuit of claim 1, wherein the plurality of transistors are controlled by a plurality of complementary address signals.

5. A defect address storing circuit for a semiconductor memory device, the defect address storing circuit comprising:
a plurality of fuse pairs formed in a fuse region; and,
a plurality of transistor pairs respectively connected to the plurality of fuse pairs and formed in a line in a transistor region outside the fuse region;
wherein the plurality of fuse pairs and the plurality of transistor pairs are arranged to form a continuous current path through at least one fuse in each of the plurality of fuse pairs, and through at least one transistor in each of the plurality of transistor pairs; and,
wherein:
the fuses within each fuse pair are electrically connected to each other;
the transistors within each transistor pair are electrically connected to each other; and,
the plurality of fuse pairs comprises first and second fuse pairs formed adjacent to each other in the fuse region and connected to each other through corresponding first and second transistor pairs formed in the transistor region.

6. The defect address storing circuit of claim 5, wherein the plurality of transistors are metal-oxide (MOS) transistors.

7. The defect address storing circuit of claim 5, wherein the plurality of fuse pairs are formed in a line in the fuse region.

8. The defect address storing circuit of claim 5, further comprising:
a bus line connected to the plurality of transistors.

9. The defect address storing circuit of claim 5, wherein the plurality of transistor pairs comprises:
first and second transistor pairs formed adjacent to each other in the transistor region and connected to each other through corresponding first and second fuse pairs formed in the fuse region.

10. The defect address storing circuit of claim 5, wherein the plurality of transistor pairs are controlled respectively by a plurality of complementary address signal pairs.

11. A defect address storing circuit for a semiconductor memory device, the defect address storing circuit comprising:
a first plurality of fuse pairs formed in a first fuse region;
a second plurality of fuse pairs formed in a second fuse region;
a first plurality of transistor pairs formed in a first transistor region between the first and second fuse regions; and,
a second plurality of transistor pairs formed in a second transistor region between the first transistor region and the second fuse region;
wherein the first plurality of fuse pairs and the first plurality of transistor pairs are arranged to form a first continuous current path through at least one fuse in each of the first plurality of fuse pairs, and through at least one transistor in each of the first plurality of transistor pairs; and,
wherein the second plurality of fuse pairs and the second plurality of transistor pairs are arranged to form a second continuous current path through at least one fuse in each of the second plurality of fuse pairs, and through at least one transistor in each of the second plurality of transistor pairs.

12. The defect address storing circuit of claim 11, wherein the first and second pluralities of transistors are metal-oxide (MOS) transistors.

13. The defect address storing circuit of claim 11, wherein the first plurality of fuse pairs are formed in a line in the first fuse region, the second plurality of fuse pairs are formed in a line in the second fuse region, the first plurality of transistor pairs are formed in a line in the first transistor region, and the second plurality of transistor pairs are formed in a line in the second transistor region.

14. The defect address storing circuit of claim 11, further comprising:
a first bus line connected to the first plurality of transistor pairs.

15. The defect address storing circuit of claim 14, wherein the first bus line provides a plurality of complementary address signal pairs for respectively controlling the first plurality of transistor pairs.

16. The defect address storing circuit of claim 14, further comprising:
a second bus line connected to the second plurality of transistor pairs.

17. The defect address storing circuit of claim 14, wherein the first bus line provides a plurality of complementary address signal pairs for respectively controlling the first plurality of transistor pairs; and,
wherein the second bus line provides a plurality of complementary address signal pairs for respectively controlling the second plurality of transistor pairs.

18. The defect address storing circuit of claim 11, further comprising:
a bus line connected to the first and second pluralities of transistor pairs.

19. The defect address storing circuit of claim 13, wherein the fuses within each fuse pair in the first and second pluralities of fuse pairs are electrically connected to each other; and,
wherein the transistors within each transistor pair of the first and second pluralities of transistor pairs are electrically connected to each other.

* * * * *